United States Patent [19]

Tsuruta et al.

[11] Patent Number: 5,164,218
[45] Date of Patent: Nov. 17, 1992

[54] SEMICONDUCTOR DEVICE AND A METHOD FOR PRODUCING THE SAME

[75] Inventors: Kazuhiro Tsuruta; Mitutaka Katada, both of Nishio; Seiji Fujino; Masami Yamaoka, both of Anjyo, all of Japan

[73] Assignee: Nippon Soken, Inc., Nishio, Japan

[21] Appl. No.: 731,268

[22] Filed: Jul. 17, 1991

Related U.S. Application Data

[62] Division of Ser. No. 521,730, May 11, 1990, abandoned.

[30] Foreign Application Priority Data

May 12, 1989 [JP] Japan ................................. 1-119268
Oct. 30, 1989 [JP] Japan ................................. 1-282396

[51] Int. Cl.$^5$ ............................................. H01L 49/00
[52] U.S. Cl. ..................................... 437/6; 437/249; 437/226; 437/65; 148/DIG. 12
[58] Field of Search .................... 437/65, 6, 63, 249, 437/226; 148/DIG. 12; 357/38, 55

[56] References Cited

U.S. PATENT DOCUMENTS

| | | | |
|---|---|---|---|
| 4,638,552 | 1/1987 | Shimbo et al. | 148/DIG. 12 |
| 4,710,794 | 12/1987 | Koshino et al. | 437/28 |
| 4,962,062 | 10/1990 | Uchiyama et al. | 148/DIG. 12 |
| 4,968,628 | 11/1990 | Delgado et al. | 148/DIG. 12 |
| 5,089,431 | 2/1992 | Slatter et al. | 148/DIG. 12 |

FOREIGN PATENT DOCUMENTS

42154 2/1986 Japan .
238033 9/1989 Japan .

*Primary Examiner*—Tom Thomas
*Attorney, Agent, or Firm*—Cushman, Darby & Cushman

[57] ABSTRACT

A semiconductor device of vertical arrangement includes an anode region formed of a first semiconductor substrate and a second semiconductor substrate joined with the first semiconductor substrate. The first semiconductor substrate forms a high-resistance layer with a predetermined impurity density, and the second semiconductor substrate forms a low-resistance layer whose impurity density is higher than that of the high-resistance layer. A PN junction is formed inside the first semiconductor substrate. The periphery of the first semiconductor substrate including the PN junction is configured in an inverted mesa structure and coated with an insulation material. With this arrangement, the semiconductor device has a high withstand voltage and enables an employment of a large diameter wafer.

13 Claims, 10 Drawing Sheets

SEMICONDUCTOR DEVICE AND A METHOD FOR PRODUCING THE SAME

This is a division of application Ser. No. 07/521,730, filed May 11, 1990 now abandoned.

BACKGROUND OF THE INVENTION

1. Field of the Invention

The present invention relates to a semiconductor device that has a high withstand voltage and enables an employment of a large diameter substrate, and a method of manufacturing this sort of semiconductor device. The present invention also relates to isolating high-voltage withstanding elements from each other in the semiconductor device.

2. Description of the Related Arts

FIG. 4 shows a planar semiconductor device. When a backward voltage is applied to a PN junction of the semiconductor device, an electric field concentrates more to a curved portion than to a flat portion. An avalanche breakdown voltage at the curved portion is, therefore, lower than that at the flat portion. To cope with this, a high-voltage withstanding structure such as a mesa structure shown in FIGS. 5(a) and 5(b) or a guard ring structure shown in FIG. 6 is employed when a high withstand voltage of 600 V or over is needed.

The mesa structure shown in FIGS. 5(a) and 5(b) is formed by obliquely polishing or etching side faces of an element. The mesa structure has a flat PN junction, and therefore, an electric field does not locally concentrate, thereby realizing a high withstand voltage. In view of an electric field at an edge of the PN junction, an inverted mesa structure shown in FIG. 5(b) is superior to a normal mesa structure of FIG. 5(a). The structure of FIG. 5(b) causes a weaker electric field at the edge of the PN junction to realize a higher withstand voltage.

Conventionally, the oblique side faces of the inverted mesa structure of FIG. 5(b) are processed in a later stage. This means that an etching quantity of the mesa will be increased as the thickness of a semiconductor substrate is increased. If a large diameter substrate is employed to improve an integration of elements, the thickness of the substrate is inevitably large, thus increasing the etching quantity. Then, even if the large diameter substrate is employed, the integration of elements will be hindered.

The guard ring structure of FIG. 6 having a PN junction with edges thereof protected with oxide films is easy to produce. If a high withstand voltage is required in the guard ring structure, however, the number of guard rings must be increased and a depletion layer horizontally extended to relax an electric field at a curved portion of the PN junction. This requires an extended area to increase the size of the structure. The curved portion cannot be eliminated from the structure, so that the withstand voltage thereof will be lower than that with a flat junction.

The inverted mesa structure of FIG. 5(b) is called a bevel structure. In this structure, elements are formed and then isolated from each other by chemical etching carried out on the reverse side of the structure. When a large diameter wafer is employed, the wafer is thick to increase an etching quantity. This reduces an effective area of each element. The bevel structure is, therefore, not suitable for manufacturing semiconductor devices from the large diameter wafer. According to the bevel structure, elements and wires electrodes are firstly formed, and the elements are then isolated from each other by chemical etching, so that isolated or etched side faces of the elements are exposed and unable to be coated with protective films such as thermal oxidation films.

SUMMARY OF THE INVENTION

To solve these problems, an object of the present invention is to provide a semiconductor device that has a high withstand voltage and enables an employment of a large diameter substrate, and a method of manufacturing such kind of semiconductor device.

Another object of the present invention is to provide a semiconductor device of vertical arrangement including a power element and a logic element formed on the same chip, and a method of manufacturing such kind of semiconductor device. The elements of the semiconductor device are isolated from each other with no increase in the size of a substrate area needed for securing a high-voltage withstanding structure for the power element.

In order to accomplish the objects, the present invention provides a semiconductor device of vertical arrangement including an anode region formed of a high-resistance layer with a predetermined impurity density and a low-resistance layer whose impurity density is higher than that of the high-resistance layer. The semiconductor device comprises a first semiconductor substrate having one main face and an opposite main face, the high-resistance layer being in the first semiconductor substrate adjacent to the opposite main face, a PN junction acting as a boundary of the high-resistance layer being formed from the one main face toward the inside of the first semiconductor substrate; and a second semiconductor substrate forming the low-resistance layer joined to the opposite main face of the first semiconductor substrate. Edges of the PN junction are defined by oblique side faces that are inclined such that a cross-sectional area of the first semiconductor substrate is reduced from the one main face toward the opposite main face, and such that, on the joined side of the first and second semiconductor substrates, a surface area of the second semiconductor substrate is larger than a surface area of the first semiconductor substrate.

The present invention also provides a method of manufacturing a semiconductor device, comprising a first process of forming mesa grooves each opening on a mirror-polished surface of a first semiconductor substrate and having side faces inclined at predetermined angles; a second process of directly joining the mirror-polished surface of the first semiconductor substrate to a mirror-polished surface of a second semiconductor substrate, thereby forming a joined substrate; a third process of coating walls of a space defined in the joined substrate by the oblique side faces of the mesa grooves of the first semiconductor substrate and by the mirror-polished surface of the second semiconductor substrate, with an insulation material layer; and a fourth process of forming a PN junction on the first semiconductor substrate of the joined substrate such that edges of the PN junction are on the oblique side faces.

According to the present invention, the periphery of the PN junction formed on the first semiconductor substrate is defined by the oblique side faces, so that the PN junction is flat with no curve on the periphery thereof. With the inverted mesa structure, the semiconductor device of the present invention provides a high withstand voltage and is compact.

To manufacture the semiconductor device of the present invention, mesa grooves having oblique side faces are formed on a first semiconductor substrate in the first process, a mirror-polished surface of the first semiconductor substrate is directly joined with a mirror-polished surface of a second semiconductor substrate to form a joined substrate in the second process, walls of a space defined by the oblique side faces of the mesa grooves and by the mirror-polished surface of the second semiconductor substrate are coated with an insulation material layer in the third process, and a PN junction whose periphery is on the oblique side faces coated with the insulation material layer is formed in the fourth process. The semiconductor device thus manufactured has an inverted mesa structure in which the periphery of the PN junction that determines a withstand voltage of the semiconductor device is on the oblique side faces protected by the insulation material layer, so that the device is compact, and the withstand voltage is high, stable, and not so much affected by aging. Even if the thickness of the second semiconductor substrate forming a high-density region is increased, the depth of the mesa grooves is not changed, so that a large diameter substrate may easily be employed.

DESCRIPTION OF THE PREFERRED EMBODIMENTS

FIGS. 1(a) to 1(g) are sectional views showing manufacturing processes of a semiconductor device according to an embodiment of the present invention. FIG. 2 shows a high-voltage withstanding NPN bipolar transistor whose manufacturing processes will be explained with reference to FIGS. 1(a) to 1(g).

Figure 1A:
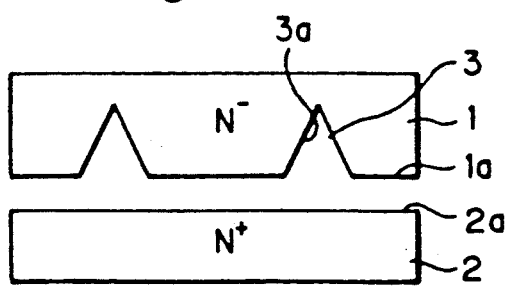
FIGS. 1(a) to 1(g) are views showing manufacturing processes of a semiconductor device according to an embodiment of the present invention.
Figure 2:
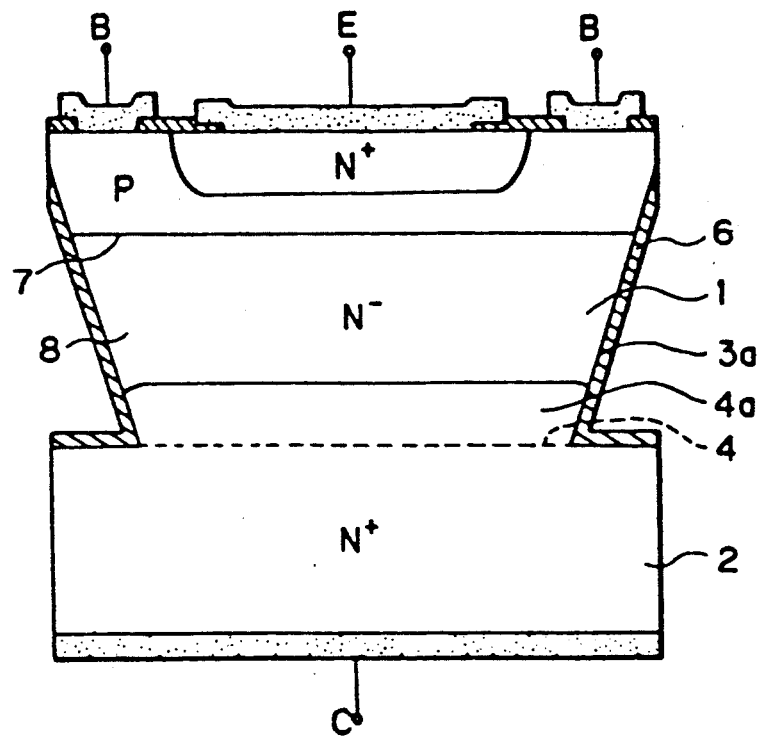
FIG. 2 is a sectional view showing a high-voltage withstanding NPN bipolar transistor manufactured according to the processes of FIGS. 1(a) to 1(g)

In FIG. 1(a), a high resistance N⁻ substrate 1 (a first substrate) has a mirror-polished surface 1a, on which mesa grooves 3 are formed in crosswise directions (only those of one direction are seen in FIG. 1(a)) by mechanical polishing or chemical etching. Each of the mesa grooves 3 has oblique side faces 3a and is opened at each edge of the substrate 1. The first semiconductor substrate 1 and a low resistance N⁺ semiconductor substrate 2 (a second substrate) are sufficiently washed to remove natural oxide films from the surfaces thereof. With a solution of, for example, $H_2SO_4:H_2O_2=3:1$, thin oxide films each having a thickness of 15 Å or thinner are formed on the surfaces of the substrates 1 and 2 to provide them with a hydrophilic property. Thereafter, the substrates 1 and 2 are washed with pure water. The surfaces of the substrates 1 and 2 are dried by dry nitrogen blowing or spin drying to control water quantities on the surfaces.

Figure 1B:
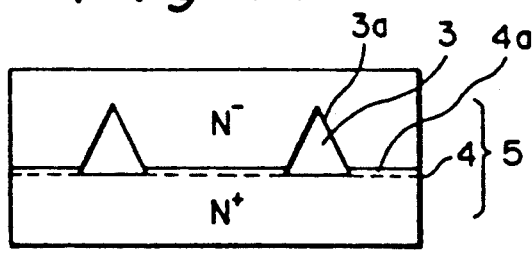

In FIG. 1(b), the mirror-polished surfaces 1a and 2a of the two substrates 1 and 2 are tightly attached to each other. The surfaces 1a and 2a are bonded to each other due to silanol radicals formed on the surfaces and hydrogen bonding of water molecules on the surfaces. The substrates 1 and 2 are dried in a vacuum to remove excessive water remaining on a bonded face 4. At this time, the mesa grooves 3 act as paths for discharging the water remaining on the bonded face 4, thereby improving uniformity of the bond. To improve solidness of the substrates 1 and 2, a load of 30 g/cm₂ or more may be applied to the substrates 1 and 2.

The substrates 1 and 2 are then heat-treated for one hour or longer at 1100° C. or higher in an inert gas atmosphere such as a nitrogen or argon atmosphere. With this heat treatment, a dehydrate condensation reaction occurs on the bonded face 4 to form a couple (Si—O—Si) of silicon (Si) and oxygen (O). Further, oxygen diffuses in the substrates to form a couple of silicon (Si—Si), and the two substrates 1 and 2 are directly joined with each other and completely solidified. This joined substrate will be represented by numeral 5. The mesa grooves 3 are hollow. A diffused layer 4a is formed in the first semiconductor substrate 1 adjacent to the bonded face 4.

Figure 1C:
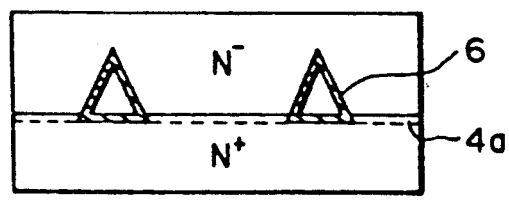

In FIG. 1(c), the joined substrate 5 is heat-treated for one hour or longer at 900° C. or higher in an oxidizing atmosphere such as combustible mixed gases of or $H_2$, and $O_2$, dry $O_2$, or wet $O_2$, to oxidize the oblique side faces 3a of the mesa grooves 3 inside the joined substrate 5. Accordingly, each of the oblique side faces 3a of the mesa grooves 3 is protected with an oxide film 6. To completely protect every oblique side face 3a, the side face 3a may be coated with an insulation material film such as a nitride or silicate glass film that may be formed by low pressure CVD.

Figure 1D:
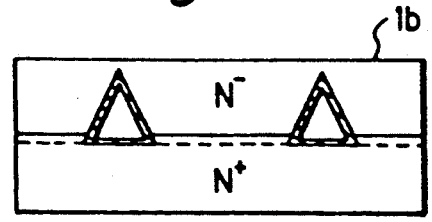
Figure 1E:
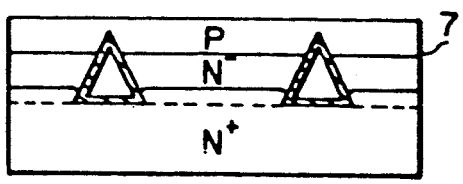

In FIG. 1(d), a surface 1b of the joined substrate 5 on which a P layer is to be formed in a process of FIG. 1(e), is lapped. This lapping must be done such that a PN junction 7 that determines a withstand voltage of the semiconductor device reaches the oblique side faces 3a of the mesa grooves 3 and such that the mesa grooves 3 are not exposed on the surface 1b.

In FIG. 1(e), the PN junction 7 is formed on the joined substrate 5. In the figure, the P layer is formed by diffusing acceptor impurities such as boron on the joined substrate 5.

Figure 1F:
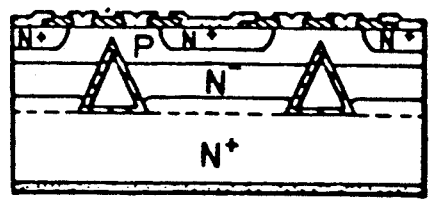

In FIG. 1(f), a mask is formed to form an emitter region, and donor impurities such as phosphorus are diffused to form an N+ layer. Thereafter, aluminum electrodes are disposed at predetermined surface locations.

Figure 1G:
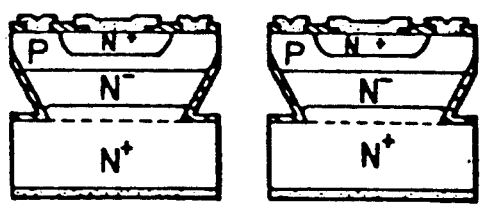

In FIG. 1(g), the mesa grooves 3 are diced to complete the high-voltage withstanding NPN bipolar transistor of FIG. 2.

In the above embodiment, the process of FIG. 1(c) of forming the insulation films and oxide films on the oblique side faces 3a is carried out before the lapping process of FIG. 1(d). Alternatively, the films may be formed after the lapping process during the process of FIG. 1(e).

The high-voltage withstanding NPN bipolar transistor of FIG. 2 has an inverted mesa structure having the oblique side faces 3a protected with the oxide films 6. In FIG. 2, the PN junction 7 for a base B and collector C is flat and formed in the inverted mesa structure. The oblique side faces 3a weaken an electric field at each edge of the PN junction 7, so that a logically presumed high withstand voltage may be materialized, depending on a substrate density.

Figures 5A, 5B:
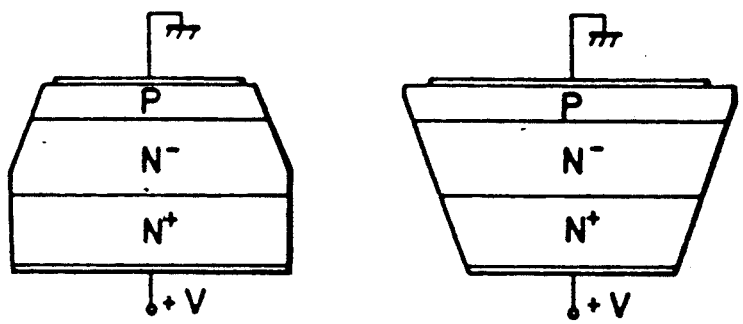
FIGS. 5(a) and 5(b) are sectional views showing mesa semiconductor devices according to prior arts.
Figure 6:
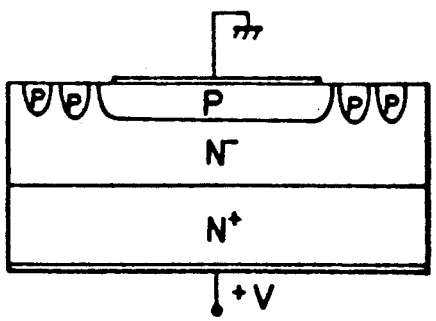
FIG. 6 is a sectional view showing a guard ring semiconductor device according to a prior art.

According to the conventional inverted mesa structure shown in FIG. 5(b), oblique side faces are formed during a dicing process after the attachment of electrodes. Therefore, the oblique side faces cannot be heat-treated to protect them with thermal oxidation films, so that edges of a PN junction are exposed on the side faces. Even if protective films such as glass films are arranged on the side faces, a withstand voltage will not be stabilized because tightness of the protective films is not secured.

According to the semiconductor device of the present invention of FIG. 2, however, the insulation protective film, i.e., the thermal oxidation film is formed on every oblique side face 3a before the final process, i.e., before the element forming process. This enables the protective film to be formed with the oxide film. Since the edges of the PN junction are protected with the thermal oxidation films, a surface leak current due to moisture absorption is reduced, and aging suppressed, thereby securing a stabilized withstand voltage.

The PN junction 7 of the present invention has no curve, so that, unlike the conventional guard ring structure, there is no need of relaxing an electric field by horizontally extending a depletion layer. According to the present invention, it is not necessary to provide a particular region for improving and therefore, the device of the present invention is compact. For example, a conventional element having a withstand voltage of 1500 V requires a guard ring region having a width of about 500 µm. According to the present invention, an etching region is needed to have a width of about 200 µm. The side of each mesa groove comes inside a semiconductor element to form a narrowed portion, which, however, will not degrade a current supplying capability, if the side of the mesa groove exists outside an emitter region, because an ON current mainly flows in the emitter region. The depth of the mesa groove is determined only by the thickness of an N− collector layer 8 that determines the withstand voltage. Even if the thickness of a substrate is increased as the diameter thereof is increased, the depth of the mesa groove, i.e., a mesa etching quantity will not be increased, unlike the conventional inverted mesa structure.

In the above explanation, the manufacturing processes of the present invention have been related to the NPN bipolar transistor. The present invention is also applicable for a PNP bipolar transistor, diode, MOS transistor, thyristor, etc.

Figure 3:
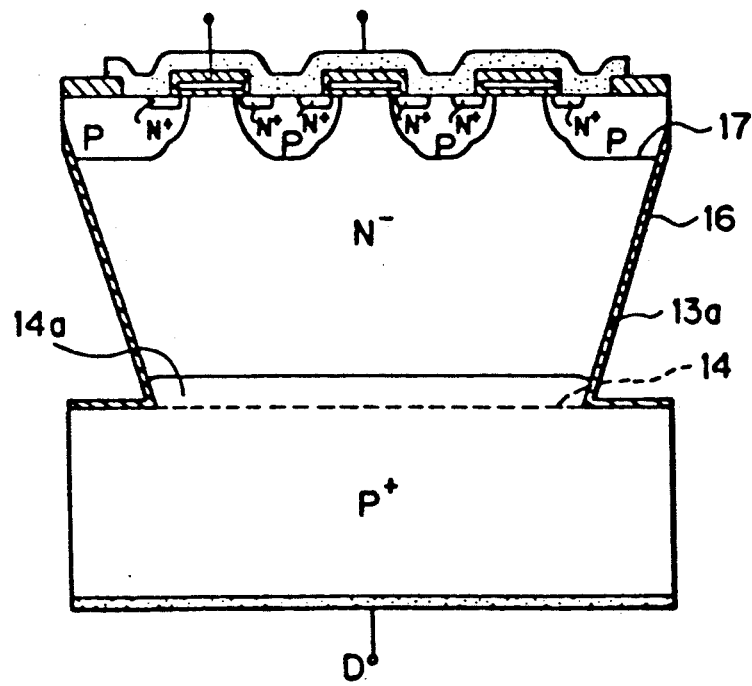
FIG. 3 is a sectional view showing a conductivity modulated MOSFET according to another embodiment of the present invention.
Figure 4:
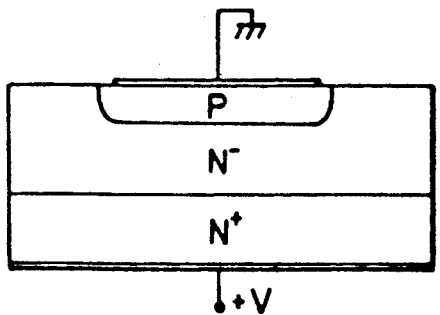
FIG. 4 is a sectional view showing a planar semiconductor device according to a prior art.

FIG. 3 is a sectional view showing a conductivity modulated MOSFET manufactured according to the present invention.

In FIG. 3, a PN junction 17 has curves. Generally, a gap between adjacent curves is so set that depletion layers under an OFF state are connected to each other to provide a withstand voltage equivalent to that derived by a flat junction. As is apparent in FIG. 3, an edge of the PN junction on the periphery of the element has no curve. This realizes a high withstand voltage as in the high-voltage withstanding NPN bipolar transistor of FIG. 1.

Each mesa groove of the semiconductor devices of FIGS. 2 and 3 is a V-shaped groove having predetermined oblique side faces. The side faces may be formed in any other shapes, provided that a cross-sectional area of the semiconductor device gradually decreases from a low-density layer toward a high-density layer around the edges of the PN junction formed on one surface (an upper surface in FIGS. 2 and 3) of the first semiconductor substrate. For example, each of the side faces may have a predetermined radius of curvature.

A relaxation of electric field at the edges of a PN junction of the inverted mesa structure will be explained. In FIG. 5(b), the strongest electric field appears on a PN- junction between a base and a collector. A cross-sectional area of the semiconductor device increases from the collector toward the base around the PN- junction, and therefore, an electric field concentration hardly occurs on an oblique side face around the PN- junction, compared to on the PN- junction inside the semiconductor device. In this way, the electric field is relaxed. When a cross-sectional area on the collector side becomes smaller, however, an interface between a high resistance collector and a low resistance collector, i.e., an N−-N+ interface causes an electric field concentration. Depending on an angle of the inverted mesa structure, therefore, the N−-N+ interface may break down before the PN-junction inside of the semiconductor device breaks down.

Figure 7:
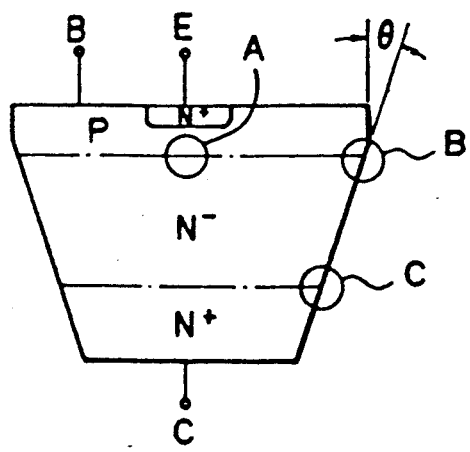
FIG. 7 is a sectional view showing an inverted mesa semiconductor device with circular marks indicating simulated portions.
Figure 8:
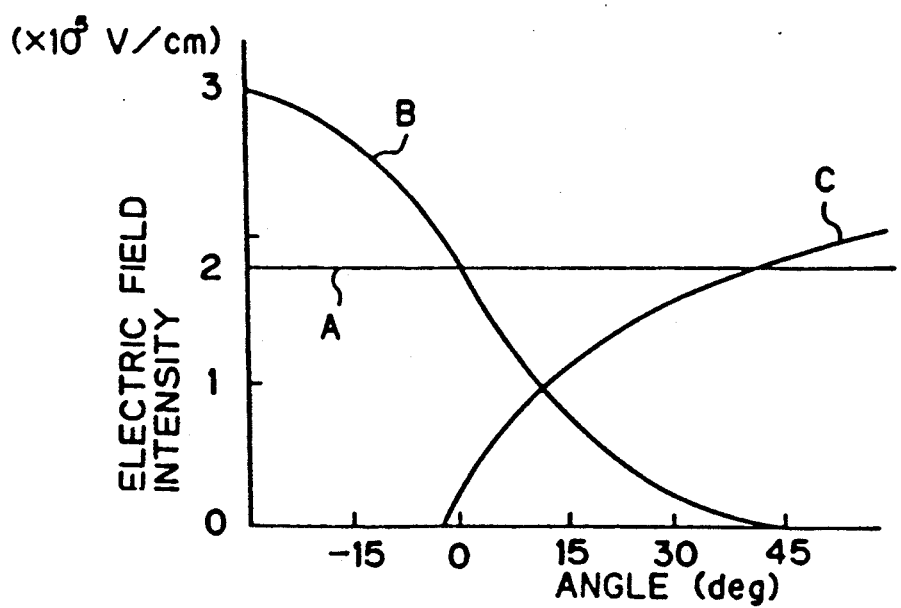
FIG. 8 is a diagram showing curves of simulated angle dependencies of electric field intersities.

The applicant of the present invention has studied the dependency of a breakdown voltage on an angle of the oblique side face by simulating electric field intensities at portions A, B, and C of the inverted mesa structure as shown in FIG. 7. FIG. 8 shows a result of the simulation. In FIG. 8, curves A, B, and C are angle dependency characteristics of electric field intensities at the portions A, B, and C, respectively. The portion A represents a PN- junction inside the mesa structure. The angle dependency characteristics of electric field intensity voltage at the portion A are constant as indicated with the curve A of FIG. 8, irrespective of an inverted mesa angle $h\theta$. The portion B corresponds to an edge of the PN- junction. As indicated with the curve B of FIG. 8, an electric field at the portion B is higher than that of the portion A when the inverted mesa angle is negative. In this case, the portion B breaks down earlier than the portion A. When the mesa angle is positive, the electric field at the portion B becomes smaller as the angle becomes larger. An electric field at the portion C increases as the inverted angle increases on the positive side. When the inverted mesa angle exceeds 45 degrees, the electric field at the portion C will be higher than that of the portion A, so that the portion C may break down before the portion A. Accordingly, an optimum inverted mesa angle will exist between 0 and 45 degrees.

With the inverted mesa angle between 0 and 45 degrees, the portions B and C will not break down before the portion A, with no particular adjustment of the impurity density and thickness of the N⁻ layer.

In the above embodiment, the oblique side face is coated with the thermal oxidation film acting as an insulation material layer. According to the present invention, the insulation material layer is not limited to the thermal oxidation film. For example, it may be an electrically neutral film such as a silicon nitride film and a semi-insulation polycrystalline silicon (SIPOS) film.

Figure 9:
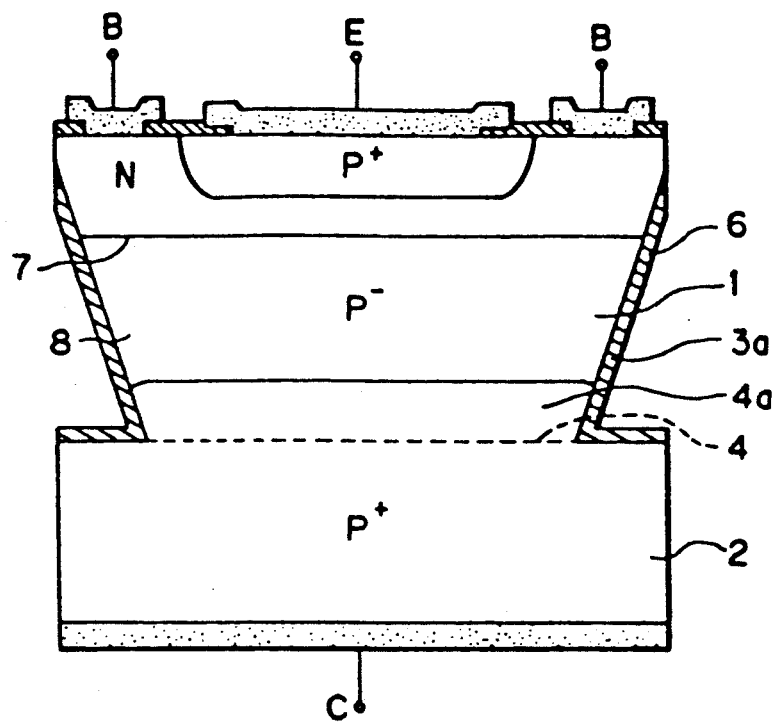
FIGS. 9 and 10 are views showing insulation material layers formed on oblique side faces, according to the present invention.

FIG. 9 shows a high-voltage withstanding PNP transistor according to the present invention. In the figure, a high resistance P⁻ layer has exposed side faces. If the side faces are coated with thermal oxidation films, inversion layers may easily be formed on the surfaces thereof due to positive charges in the thermal oxidation films. This may increase a leakage current and decrease a withstand voltage. To cope with this, an insulation material layer 6 formed of an electrically neutral film such as a nitride film or a SIPOS film may be formed instead of the thermal oxidation film. To manufacture the semiconductor device of FIG. 9, the electrically neutral film may be formed by low pressure CVD after removing an oxide film from the surface of each groove before forming electrodes in the process of FIG. 1(f).

Figure 10:
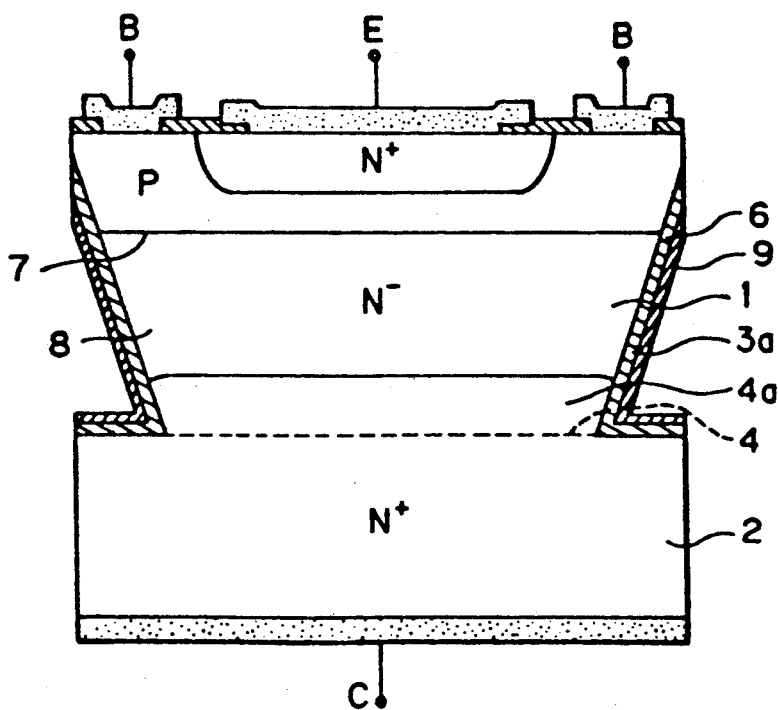

According to the present invention, the insulation material layer may be formed of a multilayer film. For example, as shown in FIG. 10, a first layer 6 comprises a thermal oxidation film, and a second layer 9 a nitride film. In forming such a multilayer film, the thermal oxidation film is formed as the first layer 6, and the nitride film 9 is formed as the second layer on the first layer 6 by the low pressure CVD. The insulation material layer composed of the multilayer film provides the following effects:

(1) In the processes to be carried out after the process of FIG. 1(d), the thermal oxidation film on the surface of each groove is prevented from being etched by acid such as hydrofluoric acid.

(2) Compared to a single thermal oxidation film, the multilayer film improves water resistance and ion resistance on the side face. When a semiconductor chip is sealed with resin, an influence of water and ion remaining in the resin can be reduced by the multilayer film, thereby improving reliability of the element.

By employing the present invention, a vertical power element portion and a logic circuit portion can be disposed on a single semiconductor chip. Without increasing the size of the power element portion, a high-voltage withstanding structure is realized, and the power element portion and the logic circuit portion may sufficiently be isolated from each other. This will be explained in detail.

Figure 11:
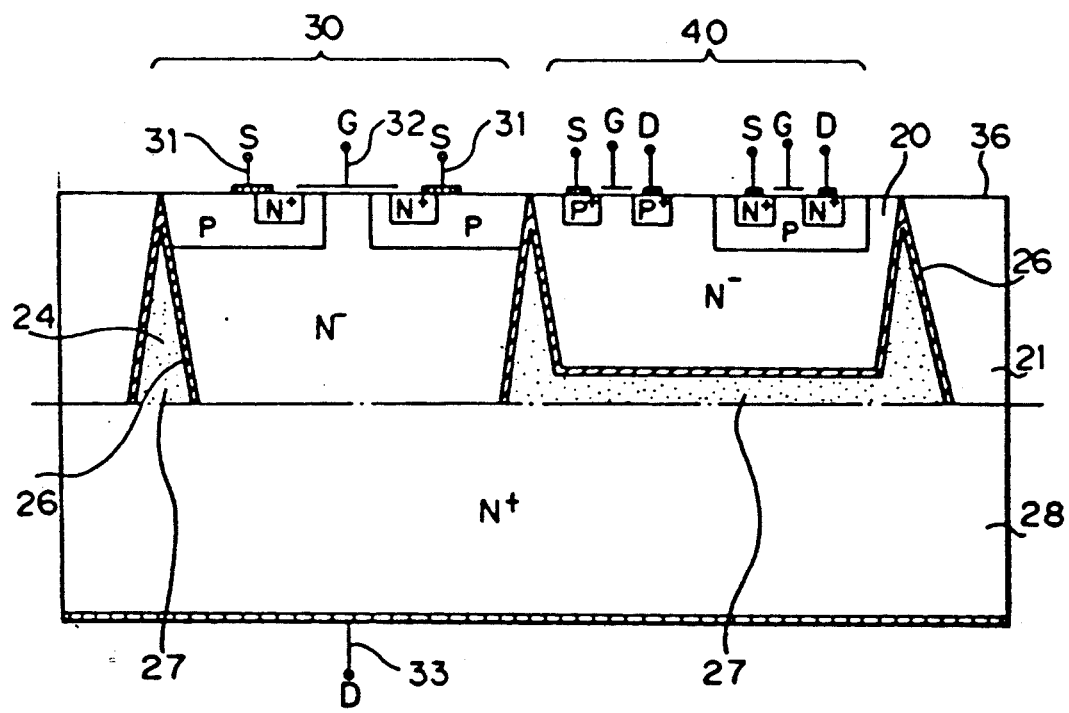
FIG. 11 is a sectional view showing a compound element structure according to still another embodiment of the present invention.

FIG. 11 is a sectional view showing a semiconductor device according to the present invention. Manufacturing processes of the semiconductor device of FIG. 11 will be explained with reference to FIGS. 12(a) to 12(h).

Figure 12A:
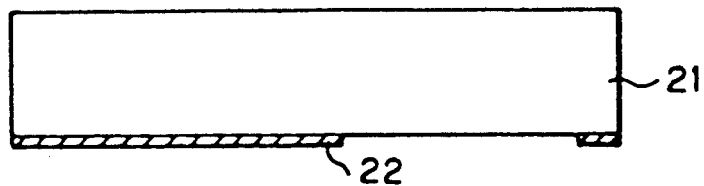
FIGS. 12(a) to 12(h) are sectional views showing manufacturing processes of the embodiment of FIG. 11.

In FIG. 12(a), a first semiconductor substrate 21 is of low density. On one surface of the semiconductor substrate 21, a mask 22 of SiO₂ film having a predetermined pattern is formed.

Figure 12B:
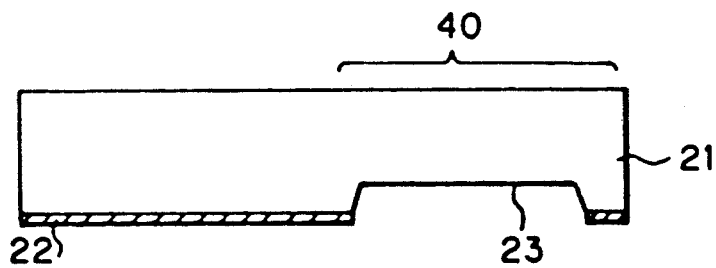

In FIG. 12(b), an area where a logic circuit 40 of SOI structure is to be formed is selectively etched into a recess 23. The depth of the recess 23 is 2 μm or deeper depending on an accuracy of silicon lapping and a withstand voltage.

Figure 12C:
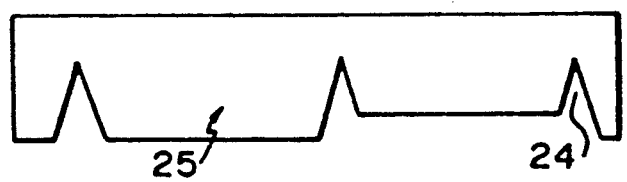

In FIG. 12(c), grooves 24 are formed on the edges of the recess 23 and of a power element forming region 25. Each of the grooves 24 has a wedge shape. Namely, the width of the groove 24 becomes narrower as the depth thereof deepens. The groove 24 may be diced with the use of an angled blade, and chemically etched by a mixed liquid of HF, HNO₃, and CH₃COOH to remove crystalline defects on side faces of the groove.

Figure 12D:
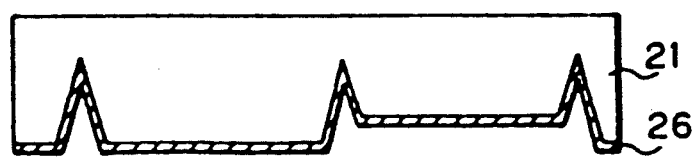

In FIG. 12(d), an insulation film 26 is formed on the surfaces of the recess 23 and grooves 24. The insulation film 26 may be a silicon oxide film formed by thermal oxidation or CVD, or a nitride silicon film formed by CVD or spattering. After the formation of the insulation film 26, a PSG or BPSG film may be formed to add a gettering effect.

Figure 12E:
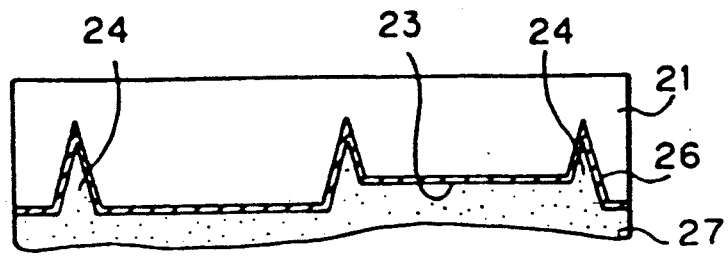

In FIG. 12(e), a shielding filler material 27 such as polycrystalline silicon, silicon oxide, and silicon nitride is deposited by CVD, spattering, or vapor deposition to fill the recess 23 and grooves 24. To reduce warp, etc., to be formed on the first semiconductor substrate 21, a thermal expansion factor of the filler material is preferable to be similar to that of the first semiconductor substrate 21. The filler material 27 is, therefore, preferable to be polycrystalline silicon, if it is selected among single materials.

Figure 12F:
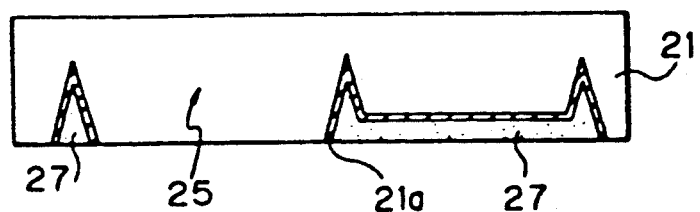

In FIG. 12(f), the filler material 27 is mirror-polished by lapping to expose the first semiconductor substrate 21 at the power element forming region 25, thus forming a mirror-polished surface 21a.

The first semiconductor substrate 21 having the mirror-polished surface 21a and a second semiconductor substrate 28 at least one face of which is mirror-polished and which is of high density are subjected to, for example, trichloroethane boiling, acetone supersonic wave cleaning, removal of organic substances by a mixed liquid of NH₃, H₂O₂, and H₂O, removal of metallic contamination by a mixed liquid of HCl, H₂O₂, and H₂O, and washing by pure water. Natural oxide films are removed from the substrates 21 and 28 by a mixed liquid of HF and H₂O, and the substrates 21 and 28 are soaked in a mixed liquid of H₂SO₄ and H₂O₂ to form an oxide film having a thickness of 15 Å or thinner on the surface of the substrates, thereby providing the substrates with a hydrophilic property. Thereafter, the substrates are washed with pure water, and dried with dry nitrogen, etc., to control water quantities on the surfaces of the substrates 21 and 28.

Figure 12G:
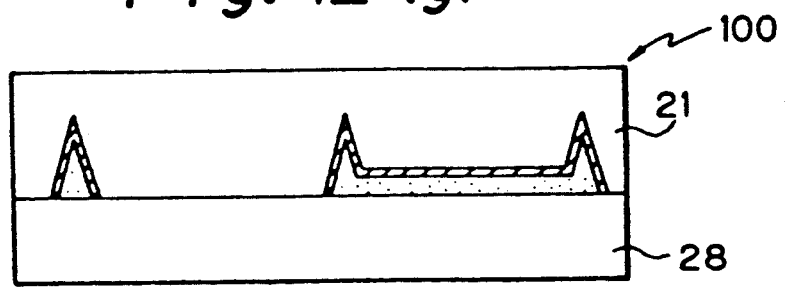

In FIG. 12(g), the mirror-polished surfaces of the two semiconductor substrates 21 and 28 are tightly attached to each other. The substrates are bonded to each other due to silanol radicals formed on the surfaces and due to hydrogen coupling of water molecules on the surfaces. The bonded substrates 21 and 28 are heat-treated for one hour or longer at 1100° C. or higher in an inert gas atmosphere such as a nitrogen or argon atmosphere. This couples Si atoms with each other, so that the two substrates 21 and 28 are strongly joined to each other into a joined substrate 100.

Figure 12H:
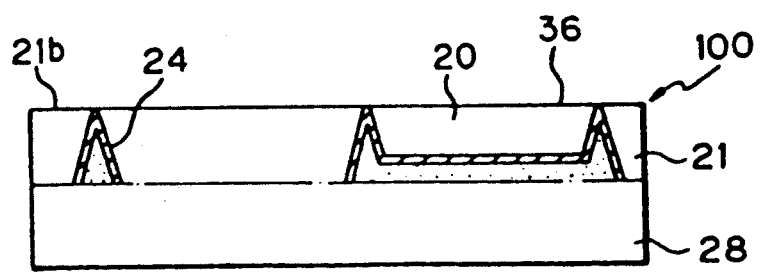

In FIG. 12(h), a surface 21b of the first semiconductor substrate 21 on the other side of the second semiconductor substrate 28 is lapped to expose the grooves 24. As a result, the joined semiconductor substrate 100 is provided with an SOI region 20 that is electrically insulated with the insulation film 26 and filled with the filler material 27 with no hollow inside the substrate.

On the joined substrate 100, predetermined elements are formed according to usual processes to complete the semiconductor device of FIG. 11.

In FIG. 11, the first substrate 21 is of N− type and the substrate 28 of N+ type that are joined to each other. A vertical power transistor 30 and a logic circuit 40 for controlling the vertical power transistor 30 are formed on the joined semiconductor substrate 100.

The vertical power transistor 30 has a source electrode 31 and a gate electrode 32 formed on the surface 21b of the first substrate 21 of the joined substrate 100. A drain electrode 33 is formed on the reverse side of the joined substrate 100, i.e., on the surface of the second substrate 28. As described before, each groove 24 is formed in a wedge shape on the joined surface inside the joined substrate 100, i.e., on the reverse side of the first substrate 21. Namely, the N− layer in the first substrate 21 has an inverted trapezoidal shape (an inverted mesa shape), and therefore, provides the same effects as those provided by the previous embodiments.

The interior of the joined substrate 100 is filled with the filler material 27 and has no hollow, so that, even if the surface 21b of the first substrate 21 is lapped in the manufacturing processes, an interface between the logic circuit 40 and the power transistor 30 may not be broken. Since the interface is exposed on the surface 21b, elements may easily be positioned at respective regions. The region 20 is formed of a monocrystalline substrate that provides the elements with excellent characteristics. The insulation layer 26 insulates and isolates the power portion 30 from the region 20, so that an isolation withstand voltage will be large, and a thermal resistance excellent.

Figure 13:
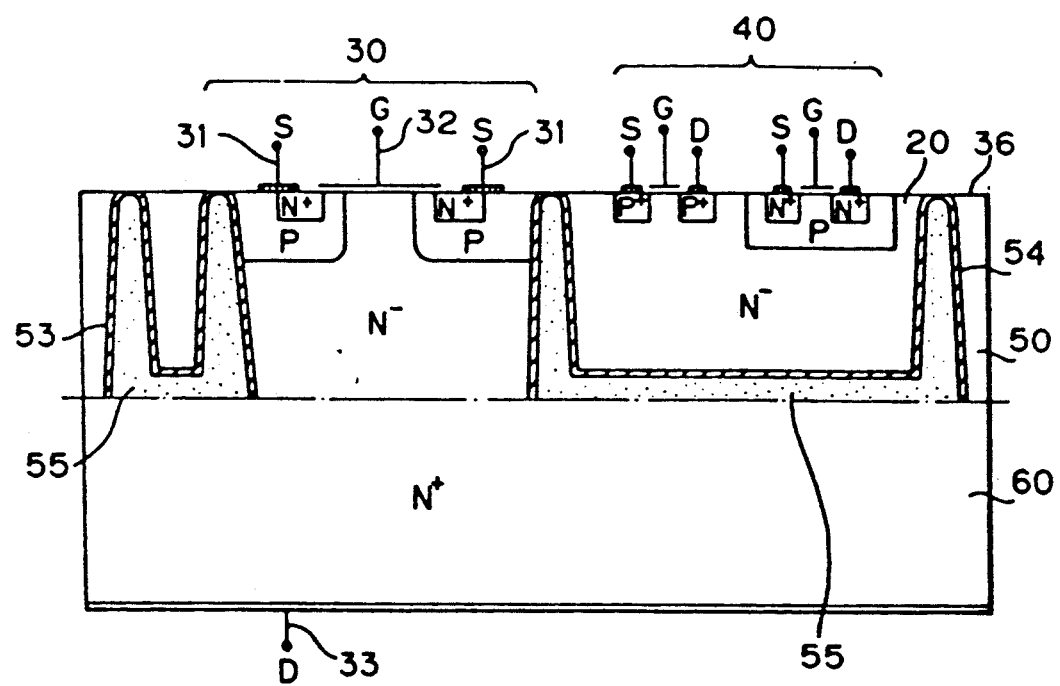
FIG. 13 is a sectional view showing a compound element structure according to still another embodiment of the present invention.

FIG. 13 is a sectional view showing an embodiment different from the embodiment of FIG. 11. Manufacturing processes of the embodiment of FIG. 13 will be explained with reference to FIGS. 14(a) to 14(f).

Figure 14:
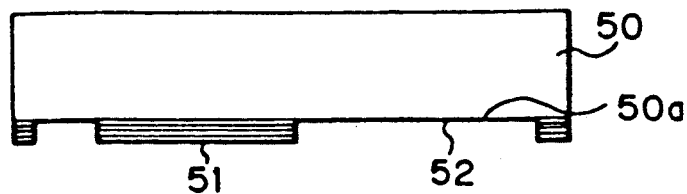
FIGS. 14(a) to 14(f) are sectional views showing manufacturing processes of the embodiment of FIG. 13.
Figure 14:
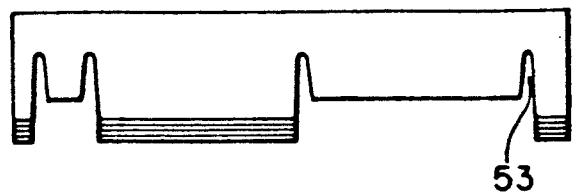
Figure 14:
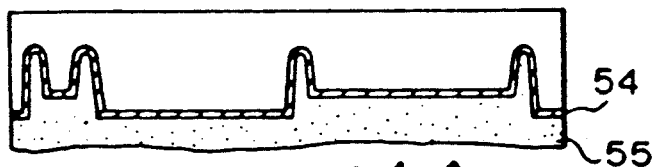
Figure 14:
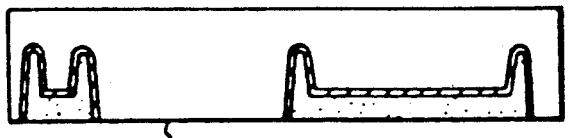
Figure 14:
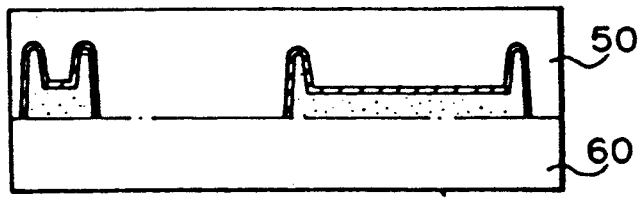
Figure 14:
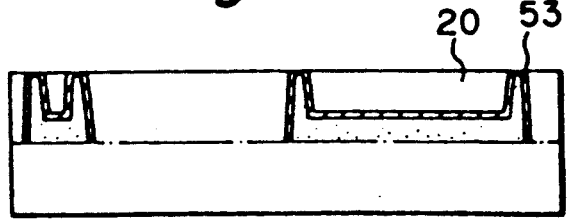

In FIG. 14(a), a first semiconductor substrate 50 is provided with a mask 51, and a window 52 is opened at an SOI region and a region corresponding to an edge of a power portion.

In FIG. 14(b), the window 52 is etched with a fluoric nitric acetic acid system etching liquid such as a mixed liquid of HF, HNO₃, and CH₃COOH. The fluoric nitric acetic acid system etching liquid has a higher etching speed at each edge of the window, so that a groove 53 is formed along each edge of the window. The etching is done to the depth that provides a predetermined withstand voltage.

In FIG. 14(c), the mask 51 is removed, and an insulation film 54 such as an oxide film is formed on an etched face 50a of the first semiconductor substrate 50, according to the same method as in the first embodiment, and filler material 55 is deposited.

In FIG. 14(d), the filler material 55 is lapped until a region for the power portion is exposed.

In FIG. 14(e), the first semiconductor substrate 50 and a second semiconductor substrate 60 are joined to each other to form a joined single substrate according to the same process of FIG. 12(g).

In FIG. 14(f), the surface of the semiconductor substrate 50 is lapped until the recesses 53 formed in the process of FIG. 14(b) are exposed, thereby forming an SOI region 20. According to usual processes, predetermined elements are formed to complete the semiconductor device of FIG. 13.

In the above explanation, the present invention has been related to the MOS structure. The present invention is also applicable for compound bipolar elements. Instead of the N substrate, a P substrate may be employed. A combination of the joined substrate and the high-voltage withstanding portion may be any of P-N, P-P, N-P, and N-N.

We claim:

1. A method of manufacturing a semiconductor device, comprising:
    a first process of forming mesa grooves each opening on a mirror-polished surface of a first semiconductor substrate and each of said mesa grooves having side walls inclined at angles;
    a second process of directly joining the mirror-polished surface of the first semiconductor substrate to a mirror-polished surface of a second semiconductor substrate, thereby forming a joined substrate;
    a third process of coating walls of a space defined in the joined substrate by oblique side walls of the mesa grooves of the first semiconductor substrate and by the mirror-polished surface of the second semiconductor substrate, with an insulation material layer; and
    a fourth process of forming a PN junction in the first semiconductor substrate of the joined substrate in a location such that edges of the PN junction are on the oblique side walls.

2. A method according to claim 1, wherein the third process is a process of heat-treating the joined substrate to coat the walls of the space defined in the joined substrate with a thermal oxidation film.

3. A method according to claim 1, further comprising a fifth process to be executed after the fourth process, of dicing the joined substrate along the mesa grooves to form separate chips.

4. A method according to claim 1, further comprising a fifth process of forming element portions on a main surface of the first semiconductor substrate, and a sixth process of dicing the joined substrate along the mesa grooves to form separate chips, the fifth and sixth processes being executed after the fourth process.

5. A method according to claim 1, wherein the third process is executed between the fifth and sixth processes.

6. A method as in claim 1 wherein said first and second semiconductor substrates are formed of monocrystalline silicon.

7. A method as in claim 1 comprising the further step of coating walls of the space in the joint substrate with an insulation film which is one of a silicon nitride film and a semi-insulation polycrystalline silicon film.

8. A method as in claim 1 comprising the further step of coating walls of the space defined in the joint substrate with a multi-layer film formed of a thermal oxidation film and another insulation material film.

9. A method as in claim 8 wherein said other material insulation film is a silicon nitride film.

10. A method as in claim 1 wherein said side faces are inclined such that an electric field intensity at a periphery of the PN junction and an electric field intensity on an interface between the high resistance layer and the low resistance layer in the region are each smaller than an electric field intensity voltage at a central area of the PN junction.

11. A method as in claim 10 wherein an angle of inclination of each of the oblique sides walls is between 0° and 45° with respect to a perpendicular of the PN junction.

12. A method of forming a semiconductor device, comprising the steps of:

forming a recess in a region on a mirror-polished surface of a first semiconductor substrate, the recess opening to the mirror-polished surface;

forming a plurality of mesa grooves on the periphery of the recess and at a position spaced apart from the periphery by a distance, each of the mesa grooves having oblique side walls and a depth deeper than that of the recess;

coating the surface on which the recess and mesa grooves have been made with an insulation material, and filling the recess and mesa grooves with a filler material;

mirror-polishing the surface applied with the filler material to expose another area of the mirror-polished surface of the first semiconductor substrate;

joining the mirror-polished surface of the first semiconductor substrate with a mirror-polished surface of a second semiconductor substrate, thereby forming a joined substrate;

polishing a non-mirror-polished surface of the first semiconductor substrate to expose the mesa grooves; and forming at least one isolated region in the first semiconductor substrate on the second semiconductor substrate in the joined substrate, the isolated region being defined by the mesa grooves and the recess and electrically insulated from the other regions by the insulation material and filler material, and forming functional elements having different functions in the at least one isolated regions, respectively.

13. A method as in claim 12 wherein said first and second semiconductor substrates are formed of monocrystalline silicon.

* * * * *